(12) United States Patent
Krivokapic et al.

(10) Patent No.: US 6,830,850 B1
(45) Date of Patent: Dec. 14, 2004

(54) INTERFEROMETRIC LITHOGRAPHY USING REFLECTED LIGHT FROM APPLIED LAYERS

(75) Inventors: Zoran Krivokapic, Santa Clara, CA (US); Bhanwar Singh, Morgan Hill, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 267 days.

(21) Appl. No.: 09/809,901

(22) Filed: Mar. 16, 2001

(51) Int. Cl.⁷ .................................................. G03H 1/04
(52) U.S. Cl. .............................. 430/1; 430/2; 430/394; 438/587
(58) Field of Search .................. 359/885, 359, 359/586; 438/587; 430/1, 2, 394, 319

(56) References Cited

U.S. PATENT DOCUMENTS

| | | | |
|---|---|---|---|
| 4,402,571 A | * | 9/1983 | Cowan et al. .................. 430/1 |
| 4,514,479 A | * | 4/1985 | Ferrante .......................... 430/2 |
| 4,799,745 A | * | 1/1989 | Meyer et al. ................. 350/1.7 |
| 5,145,756 A | * | 9/1992 | Windeln et al. ................ 430/1 |
| 5,510,215 A | * | 4/1996 | Prince et al. ................... 430/7 |
| RE36,113 E | * | 2/1999 | Brueck et al. .................. 430/1 |
| 5,952,692 A | | 9/1999 | Nakazato et al. ........... 257/321 |
| 6,291,797 B1 | * | 9/2001 | Koyama et al. ............... 216/65 |
| 6,429,108 B1 | * | 8/2002 | Chang et al. ................ 438/587 |

FOREIGN PATENT DOCUMENTS

GB 2229546 * 9/1990 .................. 359/35

OTHER PUBLICATIONS

Rong–Chung et al., "Polarizing beam splitter based on the anisotropic spectral reflectivity charachtoristic of form–birefringent multilayer gratings", Opt. Lett., vol. 21(10) pp. 761–763 (May, 1996).*

* cited by examiner

Primary Examiner—Martin Angebranndt
(74) Attorney, Agent, or Firm—Foley & Lardner LLP

(57) ABSTRACT

An interferometric lithography method includes providing a first layer of material over a substrate and providing a second layer of material over the first layer of material. The method further includes providing a layer of photoresist over the first and second layers of material and providing coherent light to the first and second layers. The coherent light has an intensity insufficient to chemically transform the photoresist. The coherent light reflects off the first and layers to interfere with an intensity sufficient to chemically transform the photoresist.

25 Claims, 2 Drawing Sheets

INTERFEROMETRIC LITHOGRAPHY USING REFLECTED LIGHT FROM APPLIED LAYERS

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE INVENTION

The present specification relates generally to fabrication processes for integrated circuits (ICs). More specifically, the present specification relates to a method of fabricating a transistor using interferometric lithography.

BACKGROUND OF THE INVENTION

The semiconductor industry needs to manufacture integrated circuits (ICs) with higher and higher densities of devices on a smaller chip area to achieve greater functionality and to reduce manufacturing costs. This need for large scale integration has led to a continued shrinking of the circuit dimensions and features of the devices.

The ability to reduce the sizes of structures (such as shorter gate lengths in field-effect transistors) is driven by lithographic technology which is, in turn, dependent upon the wavelength of light used to expose the photoresist. In current commercial fabrication processes, optical devices expose the photoresist using light having a wavelength of 248 nm (nanometers). Research and development laboratories are experimenting with the 193 nm wavelength to reduce the sizes of structures. Further, advanced lithographic technologies are being developed that utilize radiation having a wavelength of 157 nm and even shorter wavelengths, such as those used in Deep Ultra-Violet (DEV) and Extreme Ultra-Violet (EUV) lithography (e.g., 13 nm).

Field effect transistors, such as MOSFETs (metal oxide semiconductor field effect transistors) are widely used in integrated circuits. One application for MOSFETS is in Complementary MOS (CMOS) circuits. CMOS circuits have the advantages of low standby power, high speed, and high noise immunity.

CMOS circuits require a balanced pair of N- and P-channel enhancement-mode devices (e.g., MOSFETS) on the same chip. This is typically achieved by fabricating one device on a substrate having one polarity type (e.g., N) and another in a well doped with an opposite impurity type (e.g., P). However, conventional techniques are unable to further reduce the gate lengths and other feature sizes of the CMOS circuit. Further reduction in the gate lengths and other feature sizes is required for improved speed, density, and functionality.

Another application for MOSFETs is in nonvolatile memory integrated circuits (e.g., flash, EPROM, EEPROM, etc.). Nonvolatile memory integrated circuits are used in a wide variety of commercial and military electronic devices, including handheld telephones, radios and digital cameras. The market for these electronic devices continues to demand lower voltage, lower power consumption and decreased chip size. Also, the demand for greater functionality is driving the design rule lower, from the 0.35–0.25 micron technology of today to 0.18 micron, 0.15 micron and lower.

A conventional flash memory cell of a flash memory IC includes a tunnel oxide layer disposed over a silicon substrate. The memory cell further includes a first polysilicon layer, an interpoly dielectric layer, a second polysilicon layer, a silicide layer, and sidewall spacers. In operation, a data element is stored on the first polysilicon layer, also called the floating gate. Access to the data element is obtained via the second polysilicon layer, also called the control gate or wordline. While the voltage of the data element is typically on the order of 3.3 Volts, the voltage that must be applied to the control gate to access this data element is on the order of 9 Volts. Thus, a charge pump is located on the flash memory IC to raise the chip voltage from 3.3 Volts to a target voltage of 9 Volts.

MOSFETs have been fabricated using interferometric lithography to achieve a smaller critical dimension (CD). Conventional interferometric lithography is able to achieve a CD of $\lambda/4$, where $\lambda$ is the wavelength of the light source. In conventional interferometric lithography, a coherent laser light is split using a beam splitter. Mirrors redirect the split laser light to form an interference pattern on a layer of photoresist on a substrate. Interference in the light causes a one-dimensional grating pattern having the improved CD. No mask is used in this process.

The CD achieved with conventional interferometric lithography is still limited by the wavelength of the light used. A further reduction in feature sizes beyond that currently available with conventional interferometric lithography is required. Furthermore, the conventional process utilizes complex and costly equipment including a beam splitter and mirrors.

Accordingly, what is needed is an improved interferometric lithography technique for the fabrication of devices on an integrated circuit. Further, what is needed is a lithographic method that fabricates gates having a smaller gate width than using conventional techniques. Further still, what is needed is a system and method for interferometric lithography that requires less complex and less costly equipment. Further yet, what is needed is a system and method of interferometric lithography suitable for CMOS circuits, flash memory cells, and/or other devices. The teachings hereinbelow extend to those embodiments which fall within the scope of the appended claims, regardless of whether they accomplish one or more of the above-mentioned needs.

SUMMARY OF THE INVENTION

According to one exemplary embodiment, an interferometric lithography method includes providing a first layer of material over a substrate and providing a second layer of material over the first layer of material. The method further includes providing a layer of photoresist over the first and second layers of material and providing coherent light to the first and second layers. The coherent light has an intensity insufficient to chemically transform the photoresist. The coherent light reflects off the first and second layers to interfere with an intensity sufficient to chemically transform the photoresist.

According to another exemplary embodiment, a method of fabricating features on a substrate includes providing a conductive material over a substrate and providing a sandwich comprising dielectric and reflective metal layers over the conductive material. The method further includes providing a layer of photoresist over the sandwich and exposing the layer of photoresist to a coherent light at an acute angle $\theta$ with respect to the substrate. Portions of the photoresist layer are chemically transformed. The method further includes developing the photoresist layer and etching features into the conductive material layer through the developed photoresist layer.

According to yet another exemplary embodiment, a method of fabricating a grating pattern in a layer on a substrate includes providing first and second layers of material over the layer and providing a layer of photoresist over the first and second layers of material. The method further includes exposing the photoresist layer to electromagnetic radiation. The electromagnetic radiation interferes with the electromagnetic radiation reflected off the first and second layers to chemically transform the photoresist layer. The method further includes developing the photoresist layer and etching the layer to form a grating pattern in the layer.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF EXEMPLARY EMBODIMENTS

Figure 1:
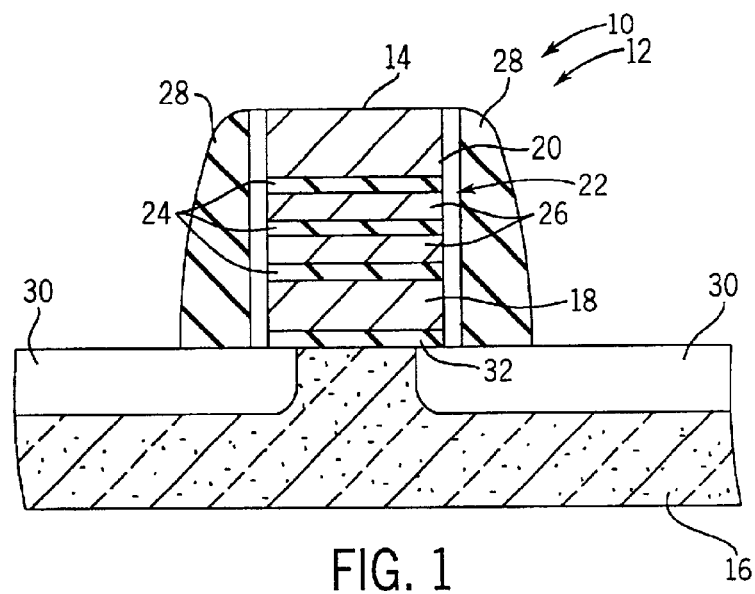
FIG. 1 is a schematic cross-sectional view of a portion of an integrated circuit fabricated by an interferometric lithography method, according to an exemplary embodiment.

Referring first to FIG. 1, a portion 10 of an integrated circuit (IC) is illustrated according to an exemplary embodiment. Portion 10 includes a device 12, such as, a transistor, capacitor, resistor, optoelectric device, microactuator, microsensor, etc. In this exemplary embodiment, device 12 is a memory cell for a flash memory device, such as, an EEPROM. The exemplary interferometric lithography method disclosed herein may also be applied to other MOSFETs, such as, CMOS transistors or to other IC features. Advantageously, device 12 has an improved structure which includes a narrower gate length or critical dimension (CD).

Device 12 includes a gate structure 14 on a semiconductor substrate 16. Substrate 16 may be silicon, gallium arsenide, germanium, or other substrate material. Gate stack 14 includes a first gate 18 (i.e., a floating gate) and a second gate 20 (i.e., a control gate).

Gate stack 14 further includes a tunnel barrier sandwich 22 comprising sandwiched layers of dielectric material and reflective materials, such as, metals. In the exemplary embodiment, tunnel barrier sandwich 22 is a quantum superlattice utilized to achieve a long retention time of a memory element on floating gate 18 and to further provide fast writing, reading, and erasing of the memory element. One such exemplary tunnel barrier sandwich is disclosed in U.S. Pat. No. 5,952,692 to Nakazato et al. The term "sandwich" as used herein refers to any physical structure that resembles a sandwich, typically including two or three or more layers of material, at least one of the layers having a different chemical, mechanical, or physical property than another of the layers.

In this exemplary embodiment, sandwich 22 includes three dielectric layers 24 and two reflective metal layers 26. Sandwich 22 is disposed between control gate 20 and floating gate 18. Dielectric layers 24 may include silicon dioxide ($SiO_2$), silicon nitride ($Si_3N_4$), or other insulative materials. Reflective layers 26 may be any type of material, such as, silicon, tantalum, titanium, or other reflective materials. In this exemplary embodiment, reflective layers 26 are approximately 3 to 4 nanometers (nm) thick and dielectric layers 24 are approximately 2 to 3 nm thick. Alternatively, sandwich 22 may comprise other structures and materials suitable for reflecting incoming electromagnetic radiation or light during an interferometric lithography process, as will be described hereinafter. For example, thickness can be increased or decreased depending upon the wavelength of light used by the lithographic system.

Gate structure 14 includes floating gate 18 and control gate 20, which may comprise polysilicon, aluminum, doped polysilicon, titanium, amorphous silicon, SiGe, titanium nitride, tantalum, tungsten, nickel, copper, silver, etc. Device 12 further includes side wall spacers 28, source and drain regions 30, a gate oxide 32, and other structures suitable for the operation of device 12.

Portion 10 is preferably part of an array of memory cells provided on an IC. The memory cells can be flash memory cells, SRAM cells, DRAM cells, or other devices requiring small gate dimensions.

Figure 2:
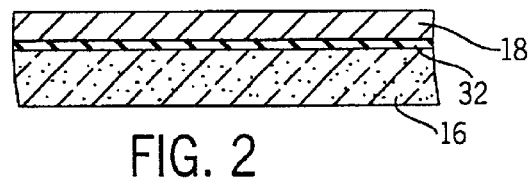
FIG. 2 is a schematic cross-sectional view of the portion of FIG. 1 illustrating a conductive layer providing step, according to an exemplary embodiment.

Referring now to FIGS. 1–6, beginning with FIG. 2, an interferometric lithography method according to an exemplary embodiment will now be described. A gate oxide material 32 is provided over substrate 16. Substrate 16 has a thickness of between 0.05 and 0.1 $\mu$n. Gate oxide 32 is provided by an oxide deposition process, such as, chemical vapor deposition (CVD), physical vapor deposition (PVD), local oxidation of silicon (LOCOS), or other gate oxide formation process. Alternatively, gate oxide 32 can be thermally grown. Gate oxide 32 is preferably provided with a thickness of between 0.6 and 1.5 nm. Gate oxide 32 may be nitrided oxide, an oxide plus nitride stack, hafnium oxide, or other suitable oxide. First conductive layer 18 is then provided over gate oxide 32 with a thickness of between 15 and 25 nm. Any conventional deposition process may be used to provide layer 18.

Figure 3:
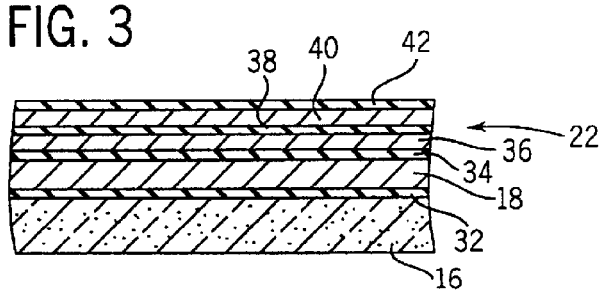
FIG. 3 is a schematic cross-sectional view of the portion of FIG. 1 illustrating a sandwich providing step, according to an exemplary embodiment.

Referring now to FIG. 3, tunnel barrier sandwich 22 is provided over first gate conductor 18. A first layer of material 34 is provided over layer 18 followed by a second layer of material 36 provided over first layer of material 34. First and second layers of material are preferably configured to reflect incoming coherent light or other electromagnetic radiation in a subsequent interferometric lithography step. In this exemplary embodiment, first layer of material 34 is a dielectric material having a thickness of between 2 and 3 nm and second layer of material 36 is a reflective layer, such as, silicon or metal, having a thickness of 3 to 4 nm. Additional dielectric layers 38 and 42 are applied and an additional reflective layer 40 is also applied in alternating arrangement to form sandwich 22 in this exemplary embodiment. While 5 layers are illustrated herein, sandwich 22 may include 2, 3, 5, 7, or more layers, depending upon the wavelength of coherent light used and other fabrication parameters. Generally, the more layers that are used in sandwich 22, the closer sandwich 22 will be to 100% reflectivity. Each of layers 34, 38, and 42 are dielectric layers comprising an oxide, such as, $SiO_2$, $Si_3N_4$, or other dielectric, approximately 2 to 3 nm thick, and each of layers 36 and 40 are silicon or metal reflective layers approximately 3 to 4 nm thick, in this exemplary embodiment. Conventional deposition processes may be used to provide layers 34–42 over gate conductor 18.

Figure 4:
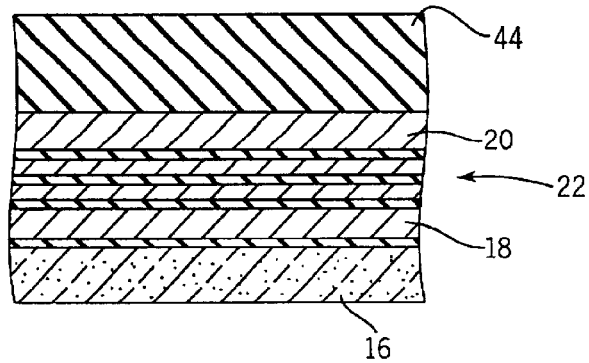
FIG. 4 is a schematic cross-sectional view of the portion of FIG. 1 illustrating a second conductive layer providing step and a photoresist providing step.

Referring now to FIG. 4, a second gate conductor 20 is provided over sandwich 22, with a thickness of between 50 and 100 nm, using a standard PVD or CVD process. In this exemplary embodiment, conductor 20 is polysilicon. A layer of photoresist 44 is provided over second conductive layer 20. Photoresist layer 44 is provided with a thickness of between 10 and 100 nm, depending upon the wavelength of exposing light used. Photoresist layer 44 may be provided by spin coating or another deposition process. Although photoresist layer 44 is provided over second gate conductor 20 in this exemplary embodiment, photoresist layer 44 may be provided directly over one or more of the layers of sandwich 22 in embodiments where other structures besides a flash memory cell are to be fabricated. For example, in the case of a CMOS circuit, only one gate conductor is used. Therefore, sandwich 22 is provided over first gate conductor 18 and photoresist layer 44 is provided directly over sandwich layer 22. Other alternative layer configurations are contemplated.

Figure 5:
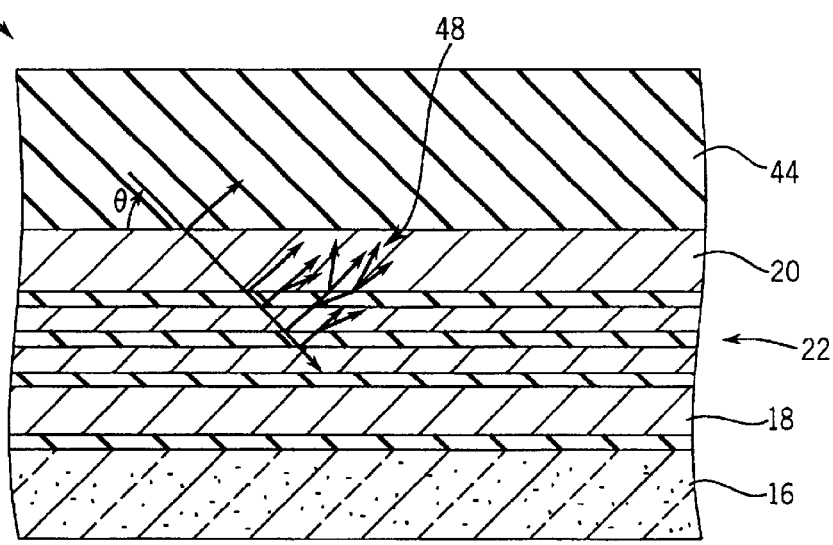
FIG. 5 is a schematic cross-sectional view of the portion of FIG. 1 illustrating an electromagnetic radiation exposing step, according to an exemplary embodiment.

Referring now to FIG. 5, electromagnetic radiation or light is provided, preferably as coherent light, to substrate 16, and more particularly, to photoresist layer 44, second gate conductor 20, sandwich 22, and first gate conductor 18. The light source may be a laser light, a conventional stepper, or any other light source suitable for exposing photoresist. Notably, the step of providing electromagnetic radiation in this exemplary embodiment does not require mirrors or beam splitters, as are used in conventional interferometric lithography, although alternative embodiments herein may utilize one or more mirrors or beam splitters.

Electromagnetic radiation or light 46 is provided in a coherent source at an angle θ with respect to substrate 16 (or with respect to one of the layers provided over substrate 16). As light 46 impinges upon layers 44, 20, 22, and 18, portions of the light are transmitted therethrough and portions of the light are reflected therefrom, in accordance with the reflective and refractive properties of the materials of said layers and the similar properties of adjacent said layers. In exemplary fashion, arrows 48 indicate several of the reflected light beams which are reflected off of layers 44, 20, 22, and 18.

Notably, the intensity of light 46 is insufficient to chemically transform photoresist layer 44 upon direct incidence from the light source. In other words, if photoresist 44 is a positive photoresist, coherent light 46 does not convert portions of photoresist 44 which are exposed to light 46 into a state that can be removed with a developer solution in a subsequent developing step. Alternatively, if photoresist layer 44 is a negative photoresist, coherent light 46 has an insufficient intensity for converting portions of photoresist layer 44 that are exposed to coherent light 46 to a chemical state that will remain after exposure to a developer solution. Accordingly, photoresist 44 may be a positive or negative photoresist, and may further include any of a variety of suitable compositions of a matrix material or resin, a sensitizer or inhibitor, and a solvent.

When coherent light 46 interferes with reflected light 48, a grating pattern of light having a sufficient exposure to chemically transform photoresist layer 44 is provided to photoresist layer 44. The resulting grating pattern will have square-like features with dimensions of $(\lambda/4)*\sin(\theta)$. The exposure flux is $2*F_o*[1+\cos(2kx\sin(\theta))]$, where $F_o$ is the flux of the coherent light 46, k is $2*\pi/\lambda$, and x is a dimension in the plane of the photoresist. $F_o$ is the flux (intensity times duration of pulse) of the incoming laser light and, as mentioned, is below the threshold of chemical transformation for the chosen photoresist layer 44.

Although, in this exemplary embodiment, dielectric layers 24 (see FIG. 1) are provided with a thickness of 2 to 3 nm and reflective layers 26 (see FIG. 1) are provided with a thickness of 3 to 4 nm, the optimum thicknesses of these layers will depend on the θ of the coherent light source. The optimum thickness will further depend upon the desired speed of access and length of retention for the memory device being fabricated.

Thus, sandwich 22 serves as a mirror to reflect coherent light 46 into incoming coherent light 46 in order to form an interference pattern with sufficient exposure intensity to expose a pattern on photoresist layer 44. Advantageously, a mask is not needed in this exemplary embodiment to form a grating pattern. In alternative embodiments, a non-critical mask may be applied over substrate 16 in order to prevent coherent light 46 from reaching portions of substrate 16 (e.g., portions to be used as logic, charge pumps, input/output devices, opto-electric devices, etc.) and to expose other portions of substrate 16 (e.g., memory portions, or other portions that would benefit from the grating pattern or other interference pattern).

In order to achieve a two-dimensional grating pattern, the step of exposing photoresist layer 44 is repeated after substrate 16 is rotated 90 degrees. The exposure flux is $2*F_o*[2+\cos(2kx\sin(\theta))+\cos(2ky\sin(\theta))]$, where x is one dimension in the plane of the photoresist and y is the other dimension in the plane of the photoresist.

According to one alternative embodiment in which a CMOS logic gate is fabricated, reflective layers 26 include tantalum or titanium and dielectric layers 24 are nitride. Layers 24 and 26 are provided over a conventional CMOS gate conductor layer. In CMOS technology, features having more than one size are required. Therefore, photoresist 44 is patterned in a non-critical conventional patterning (using a mask) in one dimension (e.g., the width direction, since the width direction is usually much larger than the length direction) to form the gate stack and the mirror layers. Next, the light is provided perpendicular to the width direction under an angle θ to obtain one-dimensional grating with a gate length of $(\lambda/4)*\sin(\theta)$. After resist development and gate stack etching, the mirror layers are removed by a stripping or polishing process. Advantageously, very fine features are patterned without an expensive mask. The mask used for the width direction patterning is inexpensive and the channel length is patterned without a mask.

Figure 6:
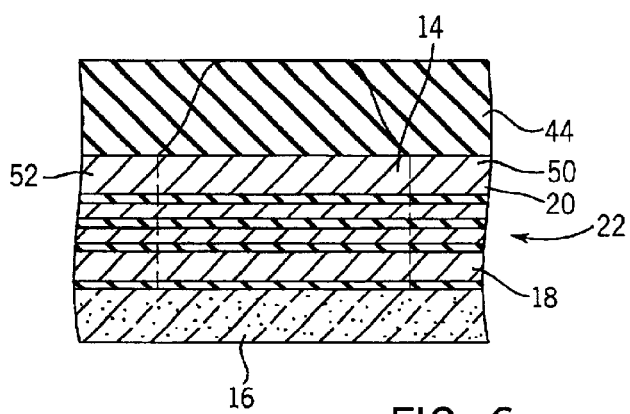
FIG. 6 is a schematic cross-sectional view of the portion of FIG. 1 illustrating an etching step, according to an exemplary embodiment.

Referring now to FIG. 6, a developing and etching step is illustrated for a positive photoresist 44 after the exposing step of FIG. 5. A conventional developer solution is used to remove portions of photoresist 44 to provide a grating pattern in photoresist 44. Portions 50 and 52 of layers 18, 22, 20, and 44 are etched away, leaving a gate stack 14. Photoresist layer 44 is then removed in a stripping process.

Referring now to FIG. 1, conventional doping or implantation processes are used to fabricate source and drain regions 30. Nitride spacers 28 are also provided by conventional processes.

While the exemplary embodiments illustrated in the FIGS. and described above are presently preferred, it should be understood that these embodiments are offered by way of example only. For example, the sandwich layer 22 may include other various shapes, structures, and materials. Accordingly, the present invention is not limited to a particular embodiment, but extends to various modifications that nevertheless fall within the scope of the appended claims.

What is claimed is:

1. An interferometric lithography method for forming an integrated circuit structure, the method comprising:

providing a first layer of material over a substrate;

providing a second layer of material over the first layer of material;

providing a layer of photoresist over the first and second layers of material; and providing coherent light to the first and second layers, wherein the coherent light has an intensity insufficient to chemically transform the photoresist, wherein the coherent light reflects off the first and second layers to interfere with an intensity sufficient to chemically transform the photoresist, wherein the photoresist layer is transformed in a pattern, the pattern being associated with the integrated circuit structure, wherein the first and second layers are part of the integrated circuit structure.

2. The method of claim 1, further comprising providing a gate conductor layer over the substrate, wherein the first and second layers of material are provided over the gate conductor layer.

3. The method of claim 2, wherein the first layer of material is a nitride and the second layer of material is a reflective metal.

4. The method of claim 2, further comprising providing a second gate conductor layer over the first and second layers of material.

5. The method of claim 4, further comprising:

developing the photoresist; and etching a gate structure into the second gate conductor layer, the first and second layers of material, and the gate conductor layer, whereby the second gate conductor layer is formed into a control gate and the first gate conductor layer is formed into a floating gate of a memory cell.

6. The method of claim 1, wherein one of the first and second layer is a dielectric and the other of the first and second layers is a reflective metal.

7. The method of claim 1, further comprising providing a third layer of material, wherein the first, second, and third layers of material form a sandwich of dielectrics and reflective metals.

8. The method of claim 1, wherein the coherent light is an Extreme Ultra-Violet (EUV) light.

9. An interferometric lithography method for forming an integrated circuit structure, the method comprising:

providing a first layer of material over a substrate;

providing a second layer of material over the first layer of material;

providing a layer of photoresist over the first and second layers of material; and providing coherent light to the first and second layers, wherein the coherent light has an intensity insufficient to chemically transform the photoresist, wherein the coherent light reflects off the first and second layers to interfere with an intensity sufficient to chemically transform the photoresist, wherein the photoresist layer is transformed in a pattern, the pattern being associated with the integrated circuit structure, wherein the first and second layers are part of the integrated circuit structure further comprising providing a third layer of material, wherein the first, second, and third layers of material form a sandwich of dielectrics and reflective metals wherein the first and third layers are dielectric layers having a thickness of 2 to 3 nanometers, wherein the second layer is a reflective metal layer having thickness of 3 to 4 nanometers.

10. A method of fabricating features for an integrated circuit, the method comprising:

providing a conductive material over the substrate;

providing a sandwich comprising dielectric and reflective metal layers over the conductive material;

providing a layer of photoresist over the sandwich;

exposing the layer of photoresist to a coherent light at an acute angle $\theta$ with respect to the substrate, whereby portions of the photoresist layer are chemically transformed;

developing the photoresist layer; and etching features into the sandwich and the conductive material through the developed photoresist layer, the features into the sandwich and the conductive material being part of the integrated circuit.

11. The method of claim 10, wherein the step of exposing does not utilize a beam splitter.

12. The method of claim 10, wherein the step of exposing does not utilize a mirror.

13. The method of claim 10, wherein a grating having features with a critical dimension of $(\lambda/4)*\sin(\theta)$ is etched in the conductive layer to form a plurality of gate conductors.

14. The method of claim 10, wherein an exposure flux of $2*F_o*$ is provided to the photoresist layer, where $F_o$ is the flux of the coherent light, k is $2*\pi/\lambda$, and x is one dimension in the plane of the photoresist.

15. The method of claim 10, wherein the coherent light has an exposure flux below the threshold of chemical transformation of the layer of photoresist.

16. A method of fabricating a grating pattern in a layer on an integrated circuit substrate, the method comprising:

providing first and second layers of material over the layer;

providing a layer of photoresist over the first and second layers of material;

exposing the photoresist layer to electromagnetic radiation, wherein the electromagnetic radiation interferes with electromagnetic radiation reflected off the first and second layers to chemically transform the photoresist layer;

developing the photoresist layer; and etching the photoresist layer to form a grating pattern in the photoresist layer, wherein the grating pattern is associated an integrated circuit structure formed from at least the first and second layers of material.

17. The method of claim 16, further comprising a third layer of material, wherein the first, second, and third layers of material form a sandwich including dielectric and reflective metal layers.

18. The method of claim 17, wherein the sandwich includes five layers having three dielectric layers and two reflective metal layers.

19. The method of claim 18, further comprising providing a gate conductor over the sandwich, wherein the step of etching forms a control gate and a floating gate for a flash memory cell.

20. The method of claim 16, further comprising rotating the substrate 90 degrees and repeating the step of exposing.

21. A method of fabricating a CMOS gate conductor, comprising:

providing a gate conductor over a substrate;

providing a sandwich layer over the gate conductor;

providing a layer of photoresist over the sandwich layer;

patterning the photoresist layer to form a first pattern; and providing light in a pattern perpendicular to the first pattern, wherein the light interferes with light reflected from the sandwich layer to provide a second pattern in the photoresist layer, wherein the sandwich layer is a capacitive structure for the gate conductor.

22. The method of claim 21, wherein the step of patterning utilizes a non-critical mask.

23. The method of claim 21, wherein the first pattern is a grating pattern.

24. The method of claim 23, wherein the first pattern has wider features than the second pattern.

25. The method of claim 24, wherein the sandwich layer includes at least three layers of alternating reflective and dielectric materials.

\* \* \* \* \*